(12) United States Patent
Kudymov et al.

(10) Patent No.: US 10,490,548 B2
(45) Date of Patent: Nov. 26, 2019

(54) INTEGRATED RESISTOR FOR SEMICONDUCTOR DEVICE

(71) Applicant: Power Integrations, Inc., San Jose, CA (US)

(72) Inventors: Alexey Kudymov, Ringoes, NJ (US); Jamal Ramdani, Lambertville, NJ (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 16/081,012

(22) PCT Filed: Apr. 8, 2016

(86) PCT No.: PCT/US2016/026708
§ 371 (c)(1),
(2) Date: Aug. 29, 2018

(87) PCT Pub. No.: WO2017/176287
PCT Pub. Date: Oct. 12, 2017

(65) Prior Publication Data
US 2019/0096877 A1    Mar. 28, 2019

(51) Int. Cl.
*H01L 27/07* (2006.01)
*H01L 27/06* (2006.01)
(Continued)

(52) U.S. Cl.
CPC ...... *H01L 27/0629* (2013.01); *H01L 21/8252* (2013.01); *H01L 27/0605* (2013.01);
(Continued)

(58) Field of Classification Search
CPC .................. H01L 27/0738; H01L 27/0705
See application file for complete search history.

(56) References Cited

U.S. PATENT DOCUMENTS 4,920,388 A * 4/1990 Blanchard ........... H01L 27/0688
257/341
5,282,107 A 1/1994 Balakrishnan
(Continued)

OTHER PUBLICATIONS

Extended European Search Report dated Feb. 25, 2019 including supplementary European search report, European search opinion, and copies of four US references (US 20130146891, US 20140327010, US 20100078732 and U.S. Pat. No. 6255679) previously submitted via IDS filed Mar. 08, 2019; 70 total pages.
(Continued)

*Primary Examiner* — Grant S Withers
(74) *Attorney, Agent, or Firm* — The Law Offices of Bradley J. Bereznak (57) ABSTRACT

A heterostructure semiconductor device includes first and second active areas, each electrically isolated from one another, and each including first and second active layers with an electrical charge disposed therebetween. A power transistor is formed in the first active area, and an integrated gate resistor is formed in the second active area. A gate array laterally extends over the first active area of the power transistor. First and second ohmic contacts are respectively disposed at first and second lateral ends of the integrated gate resistor, the first and second ohmic contacts are electrically connected to the second portion of the second active layer, the second ohmic contact also being electrically connected to the gate array. A gate bus is electrically connected to the first ohmic contact.

21 Claims, 7 Drawing Sheets

(51) Int. Cl.

| | |
|---|---|
| *H01L 29/737* | (2006.01) |
| *H01L 21/8252* | (2006.01) |
| *H01L 29/66* | (2006.01) |
| *H01L 29/86* | (2006.01) |
| *H01L 29/06* | (2006.01) |
| *H01L 29/205* | (2006.01) |
| *H01L 29/165* | (2006.01) |
| *H01L 29/778* | (2006.01) |
| *H01L 29/8605* | (2006.01) |
| *H01L 29/20* | (2006.01) |

(52) U.S. Cl.
CPC ........ *H01L 29/0642* (2013.01); *H01L 29/165* (2013.01); *H01L 29/205* (2013.01); *H01L 29/66196* (2013.01); *H01L 29/66318* (2013.01); *H01L 29/737* (2013.01); *H01L 29/7787* (2013.01); *H01L 29/86* (2013.01); *H01L 29/8605* (2013.01); *H01L 29/0649* (2013.01); *H01L 29/2003* (2013.01); *H01L 29/7786* (2013.01)

(56) References Cited

U.S. PATENT DOCUMENTS

| | | |
|---|---|---|
| 5,285,369 A | 2/1994 | Balakrishnan |
| 5,977,763 A | 11/1999 | Loughmiller et al. |
| 6,255,679 B1 | 7/2001 | Akiba |
| 6,388,853 B1 | 5/2002 | Balakrishnan et al. |
| 6,449,207 B2 | 9/2002 | Sher et al. |
| 6,630,724 B1 | 10/2003 | Marr |
| 6,635,544 B2 | 10/2003 | Disney |
| 6,640,435 B2 | 11/2003 | Balakrishnan |
| 6,668,451 B2 | 12/2003 | Balakrishnan |
| 6,750,640 B2 | 6/2004 | Balakrishnan et al. |
| 6,954,057 B2 | 10/2005 | Balakrishnan et al. |
| 6,987,299 B2 | 1/2006 | Disney et al. |
| 7,002,398 B2 | 2/2006 | Disney |
| 7,170,756 B2 | 1/2007 | Balakrishnan |
| 7,227,733 B2 | 1/2007 | Balakrishnan et al. |
| 7,205,824 B2 | 4/2007 | Disney |
| 7,221,011 B2 | 5/2007 | Banerjee et al. |
| 7,295,451 B2 | 11/2007 | Donald |
| 7,308,754 B2 | 12/2007 | Balakrishnan |
| 7,335,944 B2 | 2/2008 | Banerjee et al. |
| 7,336,095 B2 | 2/2008 | Erickson et al. |
| 7,400,483 B2 | 7/2008 | Balakrishnan et al. |
| 7,494,875 B2 | 2/2009 | Disney |
| 7,585,719 B2 | 9/2009 | Balakrishnan |
| 7,695,523 B2 | 4/2010 | Corradini et al. |
| 7,932,738 B1 | 4/2011 | Banerjee et al. |
| 7,998,817 B2 | 8/2011 | Disney |
| 8,115,457 B2 | 2/2012 | Balakrishnan et al. |
| 8,129,815 B2 | 3/2012 | Banerjee |
| 2005/0145851 A1* | 7/2005 | Johnson ............ H01L 21/28587 257/76 |
| 2010/0078732 A1 | 4/2010 | Takada |
| 2010/0163990 A1 | 7/2010 | Ko |
| 2010/0301412 A1 | 12/2010 | Parthasarathy et al. |
| 2011/0272758 A1 | 11/2011 | Banerjee et al. |
| 2013/0146891 A1 | 6/2013 | Xin et al. |
| 2014/0327010 A1* | 11/2014 | Pendharkar ......... H01L 27/0255 257/76 |

OTHER PUBLICATIONS

Extended European Search Report dated Feb. 25, 2019 including supplementary European search report, European search opinion, and copies of four US references (US 20130146891, US 20140327010, US 20100078732 and U.S. Pat. No. 6255679) previously submitted via IDS filed Mar. 8, 2019; 70 total pages.

* cited by examiner

INTEGRATED RESISTOR FOR SEMICONDUCTOR DEVICE

TECHNICAL FIELD

The present disclosure relates to semiconductor devices and processes for fabricating semiconductor devices; more specifically, to semiconductor devices utilized with switched mode power converters, and methods of manufacture thereof.

BACKGROUND

Electronic devices use power to operate. Switched mode power converters are commonly used due to their high efficiency, small size and low weight to power many of today's electronics. Conventional wall sockets provide a high voltage alternating current (ac). In a switched mode power converter, a high voltage alternating current is converted to provide a well-regulated direct current (dc) output through an energy transfer element. The switched mode power converter includes a controller which provides output regulation by sensing one or more inputs representative of one or more output quantities and controlling the output in a closed loop. In operation, a power switch is utilized to provide the desired output by varying the duty cycle (typically the ratio of the on-time of the power switch to the total switching period), varying the switching frequency, or varying the number of pulses per unit time of the power switch in a switched mode power converter.

Integrated circuits are typically formed on a wafer. The wafer is then separated into individual die which contains one copy of the integrated circuit. The controller and the power switch may be integrated in the same die or may be in two separate dice.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the disclosed devices. Also, common but well-understood elements that are useful or necessary in a commercially feasible embodiment are often not depicted in order to facilitate a less obstructed view of these various embodiments disclosed.

DETAILED DESCRIPTION

In the following description, numerous specific details are set forth in order to provide a thorough understanding of the present invention. It will be apparent, however, to one having ordinary skill in the art that the specific details need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

For purposes of this disclosure, "ground" or "ground potential" refers to a reference voltage or potential against which all other voltages or potentials of an electronic circuit or Integrated circuit (IC) are defined or measured.

As used herein, a "wafer" is a thin slice of crystalline material, such as a silicon, sapphire, silicon carbide, gallium nitride, etc., crystal, used in the fabrication of semiconductor devices and integrated circuits.

In the context of the present application, when a transistor is in an "off state" or "off" the transistor does not substantially conduct current. Conversely, when a transistor is in an "on state" or "on" the transistor is able to substantially conduct current. By way of example, a power transistor may comprise an N-channel metal-oxide-semiconductor field-effect transistor (NMOS) with a high voltage being supported between the first terminal, a drain, and the second terminal, a source. The power MOSFET may comprise a power switch that is driven by an integrated controller circuit to regulate energy provided to a load.

In one embodiment, a power transistor comprises a heterojunction field-effect transistor (HFET), also referred to as a high-electron mobility transistor (HEMT). HFETs are based on III-V direct transitional semiconductor materials such as Aluminum Indium Gallium Arsenide (AlInGaAs) compound materials or Aluminum Indium Gallium Nitride (AlInGaN) compound materials. Power MOSFETs are based on Si and other wide bandgap semiconductor materials, such as silicon carbide (SiC). Both HFETs and SiC-based power MOSFETs are advantageously utilized in certain electronic devices due to their superior physical properties over silicon-based devices. For example, GaN and AlGaN/GaN transistors are commonly used in high-speed switching and high-power applications (e.g., 200-600 V and above), such as power switches and power converters, due to the high electron mobility, high breakdown voltage, and high saturation electron velocity characteristics offered by GaN-based materials and device structures. Due to the HFETs physical properties, HFETs may change states substantially faster than other semiconductor switches that conduct the same currents at the same voltages, and the wide bandgap may improve performance of the HFET at elevated temperatures.

In accordance with embodiments of the present invention, a nitride-based HFET device structure and method of fabricating the same is disclosed which includes a monolithic integrated gate resistor in a HFET device chip. In one embodiment, the integrated device resistor does not require any additional area on the die as compared to a standard HFET device layout. In another embodiment, the gate resistance value is controlled for dynamic control over the nitride HFET switching speed, particularly at high frequency operation.

The controller for a power converter and the power switch may be integrated together in the same integrated circuit die or may be separated into different integrated circuit dies. Transistors, such as metal-oxide-semiconductor field-effect transistors (MOSFETs), heterojunction field-effect transistors (HFETs), high electron mobility transistor (HEMT), insulated-gate bipolar transistors (IGBTs), bipolar junction transistors (BJTs), injection enhancement gate transistors (IEGTs), and gate turn-off thyristors (GTOs), may be used as power switches. In addition, the power switch may be based on silicon (Si), gallium nitride (GaN) or silicon carbide (SiC) semiconductors. Transistors generally have a first and second terminal and a control terminal which controls the current between the first and second terminals. For a MOSFET or HFET, the control terminal may be referred to as the gate terminal while the first and second terminals are the drain and source terminals, respectively.

For the integrated circuit of the power switch, many individual transistors may be connected together in parallel to be used as a single power transistor. Each transistor may have a gate finger, source finger, and drain finger which are then used to couple the individual transistors together. For example, the gate fingers may couple together as a gate field plate and a gate bus. The gate bus is then coupled to a pad which is the gate terminal of the transistor. A gate resistor may be advantageously utilized to dampen oscillations caused by the low gate charge, gate capacitance, and extremely fast switching speed of a nitride-based HFET.

In example embodiments, a gate resistance is integrated in a GaN HFET utilized as the power switch. A plurality of gate fingers are coupled together to form an array of gate electrodes controlling the plurality of transistor fingers (source-drain pairs). Rather than forming the array of gate electrodes and gate bus together, the array of gates and gate bus are separated. In one example, the gate resistor is located between the array of gates and the gate bus. In particular, the gate resistor is disposed underneath the gate bus and the array of gates so as to be integrated with the HFET on the same integrated circuit die without using additional area.

Figures 1A, 1B:
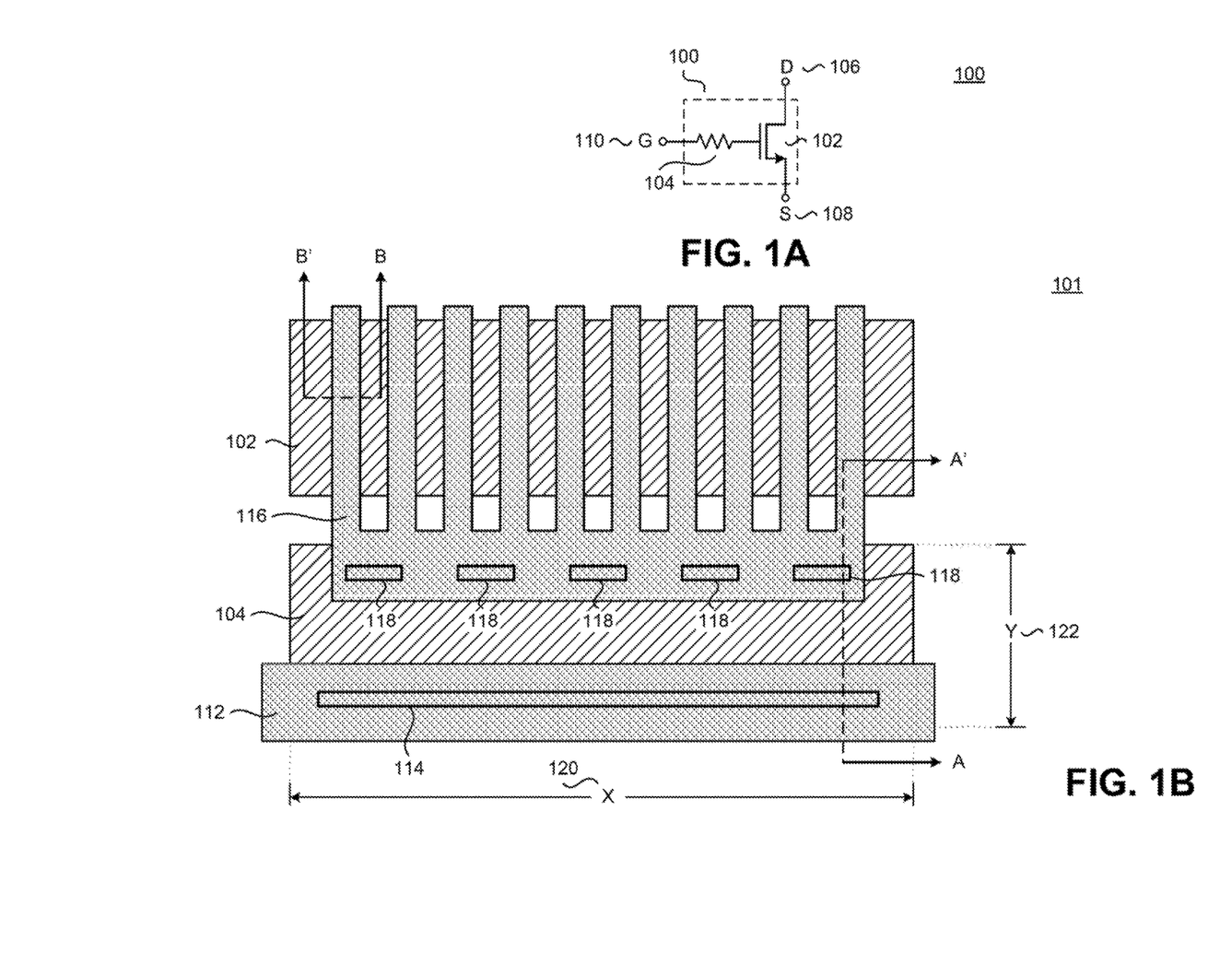
FIG. 1A is an example schematic of a semiconductor device with an integrated resistor.
FIG. 1B is a top level view of an example layout of the semiconductor device with an integrated resistor shown in FIG. 1A.

FIG. 1A illustrates an example schematic of a semiconductor device 100 with an integrated gate resistance 104. As shown, the semiconductor device 100 includes a transistor 102 and the gate resistor 104. The semiconductor device 100 further includes a drain terminal 106, a source terminal 108, and a gate terminal 110. The drain terminal 106 is coupled to the drain of transistor 102 while the source terminal 108 is coupled to the source of transistor 102. Gate terminal 110 is coupled to the gate of transistor 102 through gate resistor 104. In other words, gate resistor 104 is coupled between gate terminal 110 and the gate of transistor 102. As shown, transistor 102 is an n-type transistor, however it should be appreciated that transistor 102 may also be implemented as a p-type transistor. Further, in one embodiment transistor 102 is a GaN HFET, however, other transistor types may benefit from teachings of the present disclosure.

FIG. 1B illustrates a top level view 101 of an example layout of semiconductor device 100 with integrated gate resistor 104. The active area of transistor 102 and the active area of gate resistor 104 are denoted by the respective cross-hatched regions. It is appreciated that transistor 102 may comprise many transistors which couple together to form transistor 102. A gate array 116 is shown having a plurality of elongated members, or fingers, disposed above transistor 102. Each of the fingers extends in a first lateral direction. All of the fingers are connected to each other by a portion of gate metal disposed above gate resistor 104. The connecting portion of gate metal extends in a second lateral direction substantially perpendicular to the first lateral direction. A plurality of via ohmic contacts 118 electrically connects the gate metal to one end (upper end) of resistor 104. The gate fingers may couple to each gate of the individual transistors of transistor 102. The gate metal which includes the gate array 116 may also be used as a gate field plate. The other end (bottom end) of resistor 104 electrically connects with a gate bus 112 through via ohmic contact 114. In the completely fabricated semiconductor device, gate bus 112 is coupled to gate terminal 110 of semiconductor device 100.

Practitioners in the art will appreciate that because gate resistor 104 is located largely under gate bus 112 the device layout with integrated gate resistor shown in FIG. 1B does not require additional die area (also referred to as "real estate") as compared to conventional transistor layouts.

As shown, gate resistor 104 has an active area characterized by width Y 122 in the first lateral direction and length X 120 in the second lateral direction. In one example, the resistance of gate resistor 104 may be a sheet resistance measured in Ohm-sq. The resistance is substantially the resistivity of the material multiplied by length X 120 divided by width Y 122. In one example, the width Y 122 may be selected to be substantially equal to the width of transistor 102 while the length X 120 may be selected to reach a target resistance value.

Figure 2A:
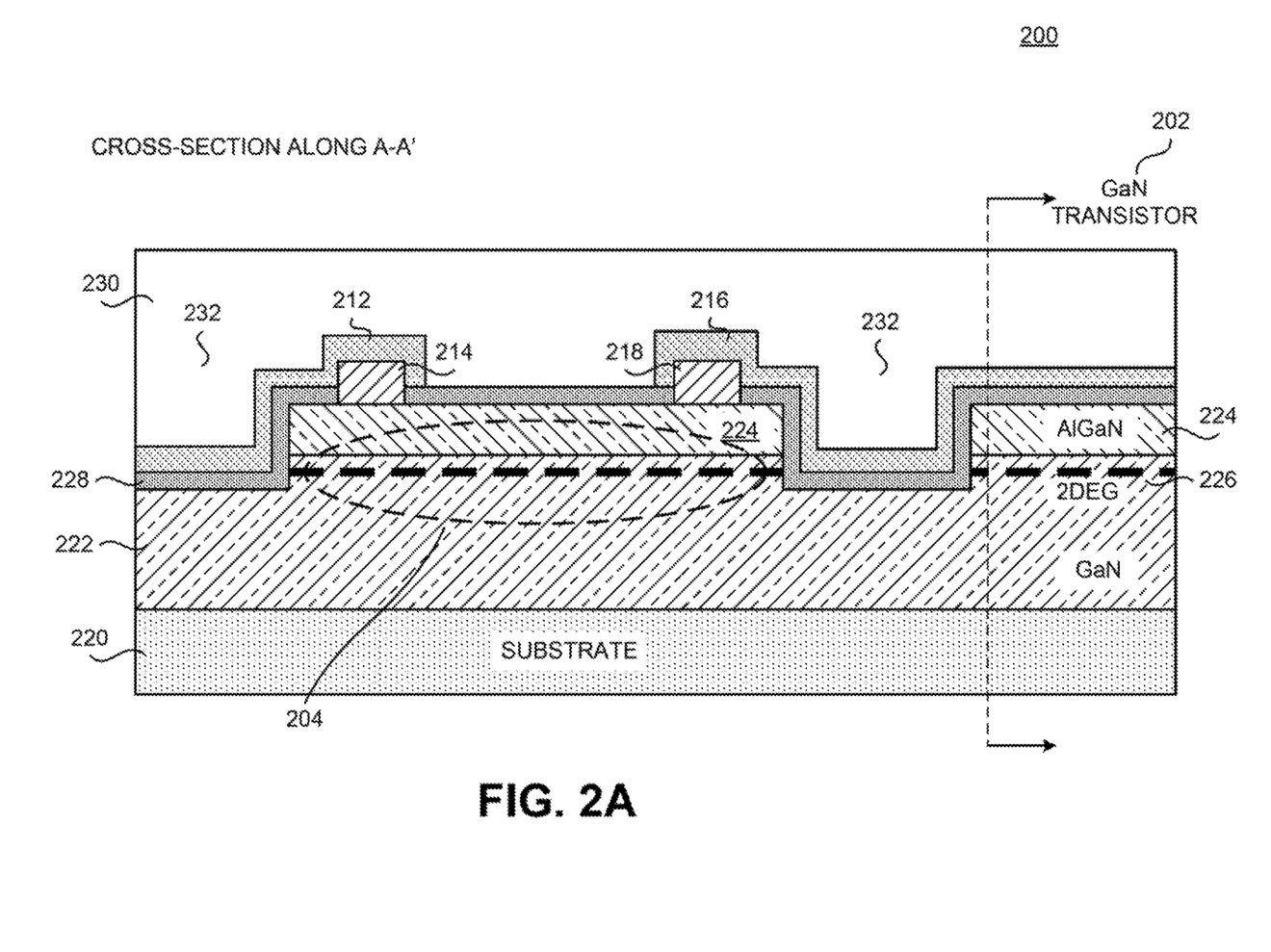
FIG. 2A is a cross sectional view of the semiconductor device with an integrated resistor of FIG. 1B taken along cut line A-A'.

FIG. 2A illustrates a cross sectional view of the semiconductor device 200 with an integrated resistor 204 of FIG. 1B taken along cut line A-A', which is substantially along the first lateral direction of semiconductor device 200. Further, the cross sectional view of FIG. 2A illustrates semiconductor device 200 when mesa etching has been utilized to fabricate semiconductor device 200, and in particular to isolate gate resistor 204 from power transistor 202.

As shown in FIG. 2A, a substrate 220 may be disposed at the bottom of semiconductor device 200, e.g., the bottom of the wafer. Substrate 220 may comprise sapphire ($Al_2O_3$), silicon (Si), gallium nitride (GaN), gallium arsenide (GaAs), silicon carbide (SiC), or other suitable substrate materials. The first active layer 222 is disposed above substrate 220 and may comprise GaN, indium nitride (InN), aluminum nitride (AlN), aluminum gallium nitride (AlGaN), indium gallium nitride (InGaN), or aluminum indium gallium nitride (AlInGaN). In other examples, first active layer 222 may comprise different semiconductor materials containing nitride compounds or other group III or group III-IV semiconductor material elements.

In one example, first active layer 222 may be in a range of 1-10 microns thick. In another example, first active layer 222 may be in a range of 2-6 microns thick. First active layer 222 may be grown or otherwise formed on substrate 220. To avoid possible problems with lattice mismatch and/or differences in thermal coefficients of expansion, one or more additional layers may be disposed between substrate 220 and first active layer 222. For example, an optional thin nucleation layer may be formed between substrate 220 and first active layer 222.

Continuing with the example of FIG. 2A, a second active layer 224 is disposed above first active layer 222. Second active layer 224 may comprise AlGaN, aluminum indium nitride (AlInN), indium arsenide (InAs), aluminum arsenide (AlAs), indium gallium arsenide (InGaAs), aluminum gallium arsenide (AlGaAs), or indium aluminum gallium arsenide (InAlGaAs). In other example, second active layer 224 may comprise different group III or group III-V semiconductor materials.

In one example, second active layer 224 may be in a range of 10-40 nanometers (nm) thick. For the example of an AlGaN second active layer 224, second active layer 224 may be 15-30% aluminum to gallium nitride. Further, the material of second active layer 224 may be a non-stoichiometric compound. In such materials, the ratios of the elements are not easily represented by ordinary whole numbers. For example, second active layer 224 may be a non-stoichiometric compound of a group III or group III-V nitride semiconductor material such as $Al_xGa_{1-x}N$, where $0<X<1$. Second active layer 224 may be grown or deposited on first active layer 222.

Further shown in FIG. 2A is an electrical charge layer 226 which may form between first active layer 222 and second active layer 224 due to the bandgap difference between the two layers, spontaneous and/or piezoelectric polarization discontinuity, or intentional doping of first active layer 222 and/or second active layer 224. Electrical charge layer 226 defines the lateral conductive channel which is sometimes called a two-dimensional electron gas (2DEG) layer because electrons, trapped in a quantum well that results from the bandgap difference between first active layer 222 and second active layer 224 are free to move in two lateral dimensions, but are tightly confined in the third (vertical) dimension. Further, first active layer 222 is sometimes called the channel layer while second active layer 224 is sometimes called the barrier layer or donor layer. For the example shown, gate resistor 204 comprises electrical charge layer 226 formed between first active layer 222 and second active layer 224.

The example of FIG. 2A includes open regions or voids 232 which separate the active area of gate resistor 204 from the active area of GaN transistor 202. Note that voids 232 are formed to span the entire vertical thickness of second active layer 224 and a portion of first active layer 222. As shown, voids 232 separate a portion (left-most) of layers 222, 224 and electric charge layer 226 comprising gate resistor 204 from another portion (right-most) of layers 222, 224 and electric charge layer 226 comprising GaN transistor 202. In one example fabrication process, voids 232 are formed using mesa etching. In other embodiments, voids 232 may be formed using well known transistor isolation methods.

The cross-sectional view of FIG. 2A shows ohmic contacts 214 & 218 disposed on second active layer 224. Ohmic contact 214 provides electrical contact to gate bus 212, while ohmic contact 216 provides electrical contact to the array of gates 216. As shown, the ohmic contacts 214 & 218 are disposed through a gate dielectric layer 228 to contact second active layer 224. Ohmic contacts 214 & 218 may be a gold-based or a gold-free material (such as titanium or aluminum). In one example, ohmic contacts 214 & 218 are formed before deposition of gate dielectric layer 228. In another example, ohmic contacts 214 & 218 are formed by etching openings in gate dielectric layer 228 followed by metal deposition and annealing steps. For the example shown, ohmic contacts 214 & 218 are disposed between the two voids 232 shown along the first lateral direction.

Note that in each voids 232, gate dielectric layer 228 is disposed directly on first active layer 224. Gate dielectric layer 228 may include various materials suitable for forming a gate insulator such as aluminum oxide ($Al_2O_3$), zirconium dioxide ($ZrO_2$), aluminum nitride (AlN), hafnium oxide ($HfO_2$), silicon dioxide ($SiO_2$), silicon nitride (SiN, $Si_3N_4$), aluminum silicon nitride (AlSiN), carbon nitride (CN), boron nitride (BN) or other suitable gate dielectric materials. In another example, gate dielectric layer 228 may comprise a nitride based material that helps conserve the atomic arrangement with the second active layer 224. Although FIG. 2A illustrates a single gate dielectric layer, it is appreciated that multiple gate dielectric layers may be utilized.

Gate bus 212 is shown disposed above ohmic contact 212 and gate dielectric layer 228 while the gate metal comprising the array of gates 216 is disposed above ohmic contact 218 and gate dielectric layer 228. A composite passivation layer 230 is disposed above gate bus 212 and array of gates 216. Further, composite passivation layer 230 is disposed above gate dielectric layer 228 between ohmic contact 214 and ohmic contact 218. Composite passivation layer 230 also fills each of voids 232. In one example, composite passivation layer 230 may include multiple dielectric layers, passivation layer, field plate material, and metal layers which make up the completely fabricated semiconductor device 200. Some of these layers may be used for electric field distribution.

In operation, electric charge in electrical charge layer 226 flows laterally between ohmic contacts 214 and 218. As such, current flows between gate bus 212 and the array of gates 216 through gate resistor 204. For the example shown in FIG. 2A, the structure of gate resistor 204 is similar to the active area structure of GaN transistor 202. As such, the gate resistance 204 may be integrated in the same die as GaN transistor 202 utilizing the same process flow.

Figure 2B:
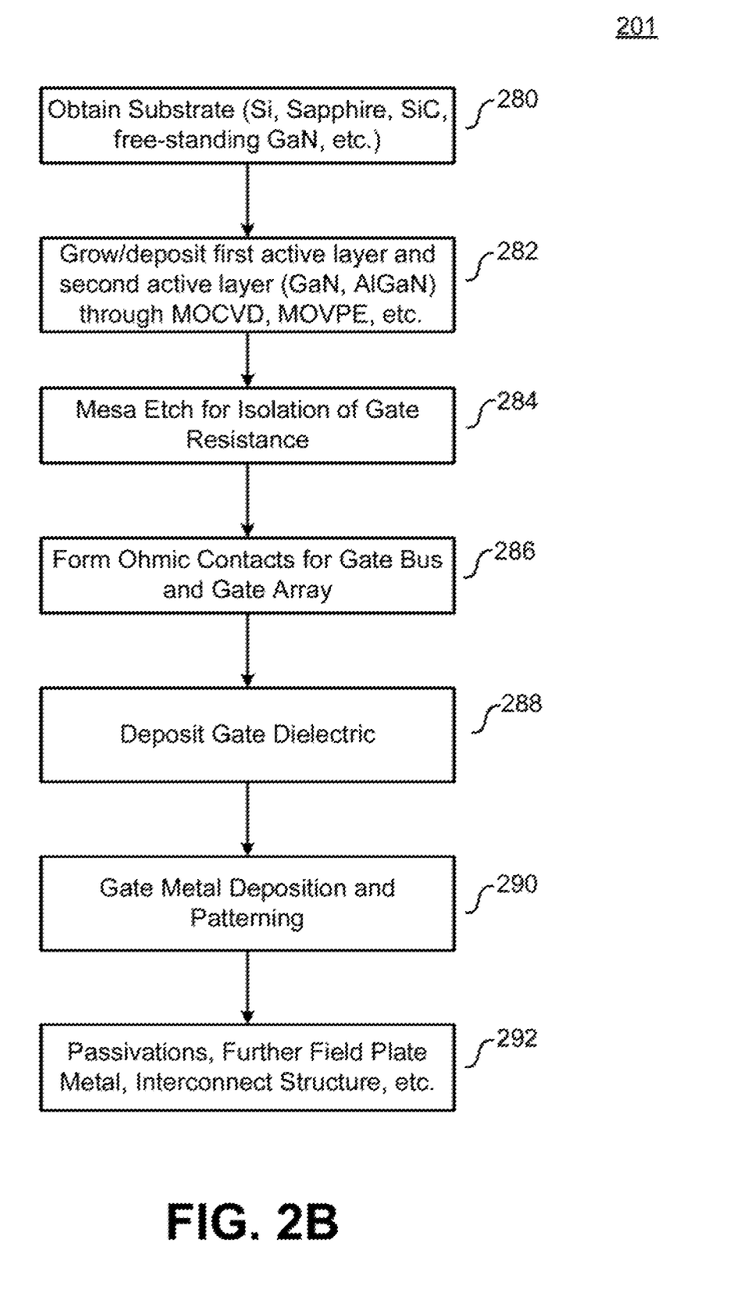
FIG. 2B is an example process flow for fabricating the semiconductor device with an integrated resistor of FIG. 2A utilizing mesa etching for isolation.

FIG. 2B is an example process flow 201 for fabricating the semiconductor device 200 with an integrated resistor as shown in FIG. 2A utilizing mesa etching. In the example shown, process 201 starts at block 280 in which a substrate is obtained. The substrate may be silicon, sapphire, SiC, free-standing GaN, or other suitable substrate material. At block 282, the first active layer and the second active layer are grown (or deposited) on the substrate. The first and second active layers may be grown or deposited using metalorganic chemical vapor deposition (MOCVD) or metalorganic vapor phase epitaxy (MOVPE). In one example, the thickness of the first active layer may be in a range of 1-10 microns thick while the second active layer may be in a range of 10-40 nm thick.

At block 284, the device is mesa etched to isolate the gate resistance from the rest of the active device. Mesa etching may be accomplished using inductively coupled plasma (ICP) etch. At block 286, the ohmic contacts for the gate bus and the array of gates are formed. The ohmic contacts may be gold-based or gold-free ohmic contacts. For gold-based ohmic contacts, the ohmic contacts are formed using a metal stack which is annealed between 850-1000 Celsius (° C.). For gold-free ohmic contacts, the ohmic contacts are formed by recess etching the second active layer (such as AlGaN), depositing a gold-free material (such as titanium, aluminum, or other suitable material) then annealing at 450-600° C.

At block 288, the gate dielectric is deposited. The gate dielectric may be deposited using plasma enhanced chemical vapor deposition (PECVD) or atomic layer deposition (ALD). At block 290, the gate metal (forming the gate bus and array of gates) is deposited and patterned. The metal is deposited in one layer then patterned/etched into separate sections. The metal deposition may be accomplished using e-beam sputtering or physical vapor deposition (PVD). The patterning/etching may be accomplished using ICP etch of wet chemical etch. At block 292, further passivation layers, dielectric layers, field plate layers, metal layers, and other interconnect structures of the device 200 are formed. These may include gate, source and drain-connected field plates, etc.

Figure 3A:
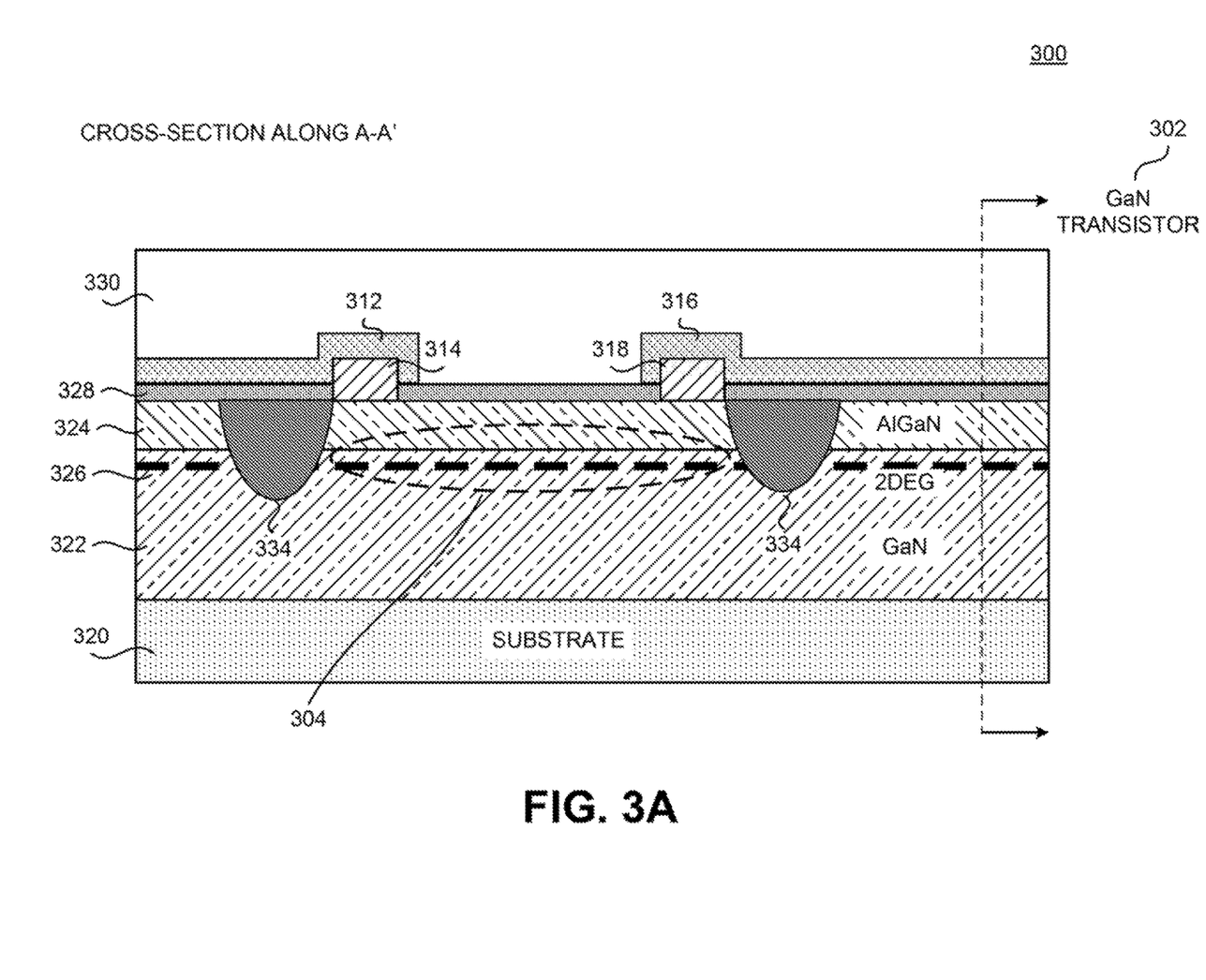
FIG. 3A is a cross sectional view of another example of the semiconductor device with an integrated resistor of FIG. 1B taken along cut line A-A'.

FIG. 3A illustrates a cross sectional view of a semiconductor device 300 with an integrated resistor 304 taken along cut line A-A' of FIG. 1B, which is substantially along the first lateral direction of semiconductor device 300. Further, the cross sectional view of FIG. 3A illustrates semiconductor device 300 when ion implantation is utilized to fabricate the semiconductor device 300.

It should be appreciated that similarly named and numbered elements couple and function as described above. The device 300 shown in FIG. 3A shares many similarities with the device 200 shown in FIG. 2A, however instead of voids to electrically isolate the active area of gate resistor 304 from the active area of GaN transistor 302, a pair of implantation regions 334 are used to separate the gate resistor 304 from GaN transistor 302. As shown, first active area 322 is disposed on top of substrate 320, and second active layer 324 is disposed on top of first active layer 322. Implantation regions 334 are disposed within first active layer 322 and second active layer 324, extending down from the top surface of second active layer 324 into first active layer 322 below 2DEG charge layer 326. In other words, implantation regions 334 extend through the entire vertical thickness of second active layer 324 and into an upper portion of first active layer 322. Implantation regions 334 electrically isolate a portion (left-most) of layers 322, 324 and electric charge layer 326 comprising gate resistor 304 from a portion (right-most) of layers 322, 324 and electric charge layer 326 comprising GaN transistor 302. In one example, implantation regions 334 may be formed using ion implantation technique and include argon (Ar), nitrogen (N), or other suitable elements implanted.

As shown in FIG. 3A, ohmic contacts 314 & 318 are respectively disposed at opposite ends of gate resistor 304, with each ohmic contact being disposed adjacent one of the implantation regions 334. Ohmic contacts 314 & 318 are shown separated along the first lateral direction. Ohmic contact 314 is covered by and electrically connected to the gate bus 312. Similarly, ohmic contact 318 is covered by and electrically connected to the array of gates 316. Gate bus 312 and the array of gates 316 are both vertically separated and insulated from the underlying implantation regions 334 and second active layer 324 by gate dielectric layer 328.

Figure 3B:
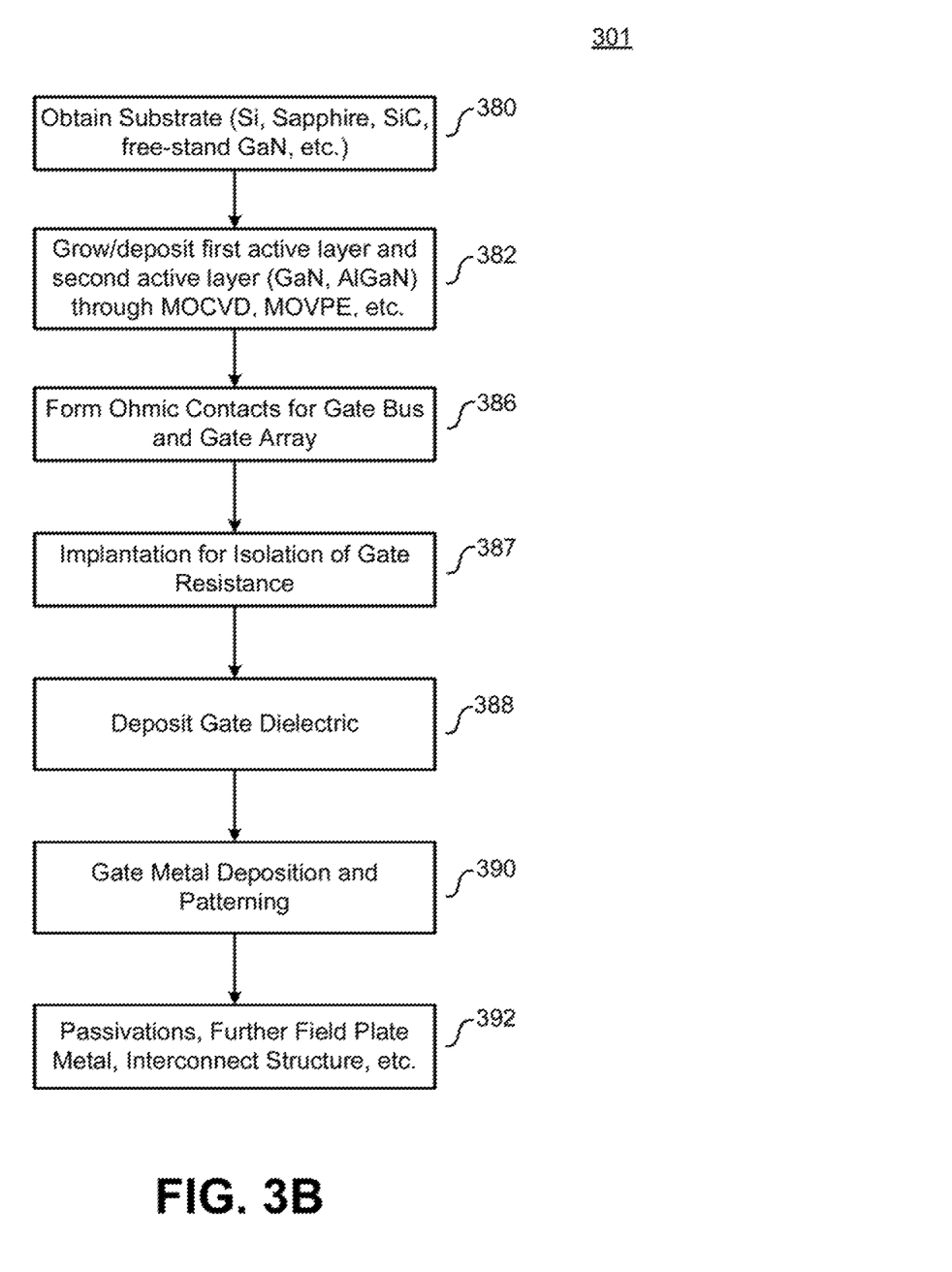
FIG. 3B is an example process flow for fabricating the semiconductor device with an integrated resistor of FIG. 3A utilizing ion implantation for isolation.

FIG. 3B is an example process flow 301 for fabricating a semiconductor device with an integrated resistor, as shown in FIG. 3A, utilizing ion implantation. It should be appreciated that process 301 is similar to process 201. Further, process blocks 380, 382, 386, 388, 390, and 392 are substantially identical to blocks 280, 282, 286, 288, 290, and 292 as discussed with respect to FIG. 2B. However, process flow 301 does not include a mesa etch isolation step (block 284), but rather includes block 387 for ion implantation to isolate the gate resistor from the active area of the transistor device.

In the example of FIG. 3B, at block 386 ohmic contacts are formed, which step occurs after block 382, which is the step to grow/deposit the first and second active layers. At block 387, ion implantation of Ar, N, or other suitable material may be accomplished using a mask and photo resist to pattern openings where the implantation regions should be located for the device 300. Further, the ohmic contacts may be used to align the mask for implantation. Once ion implantation is completed, the gate dielectric is deposited. (Block 388) Following deposition of the gate dielectric, gate metal deposition and patterning may occur. (Block 390) At block 392, passivation and metallization (e.g., field plate metal, interconnect structures, etc.) steps occur to complete fabrication. It should be appreciated that the order of steps 387, 388 and 390 may be altered, for example, the gate dielectric deposition and passivation deposition may be performed prior to the ion implantation step.

Figures 4A, 4B:
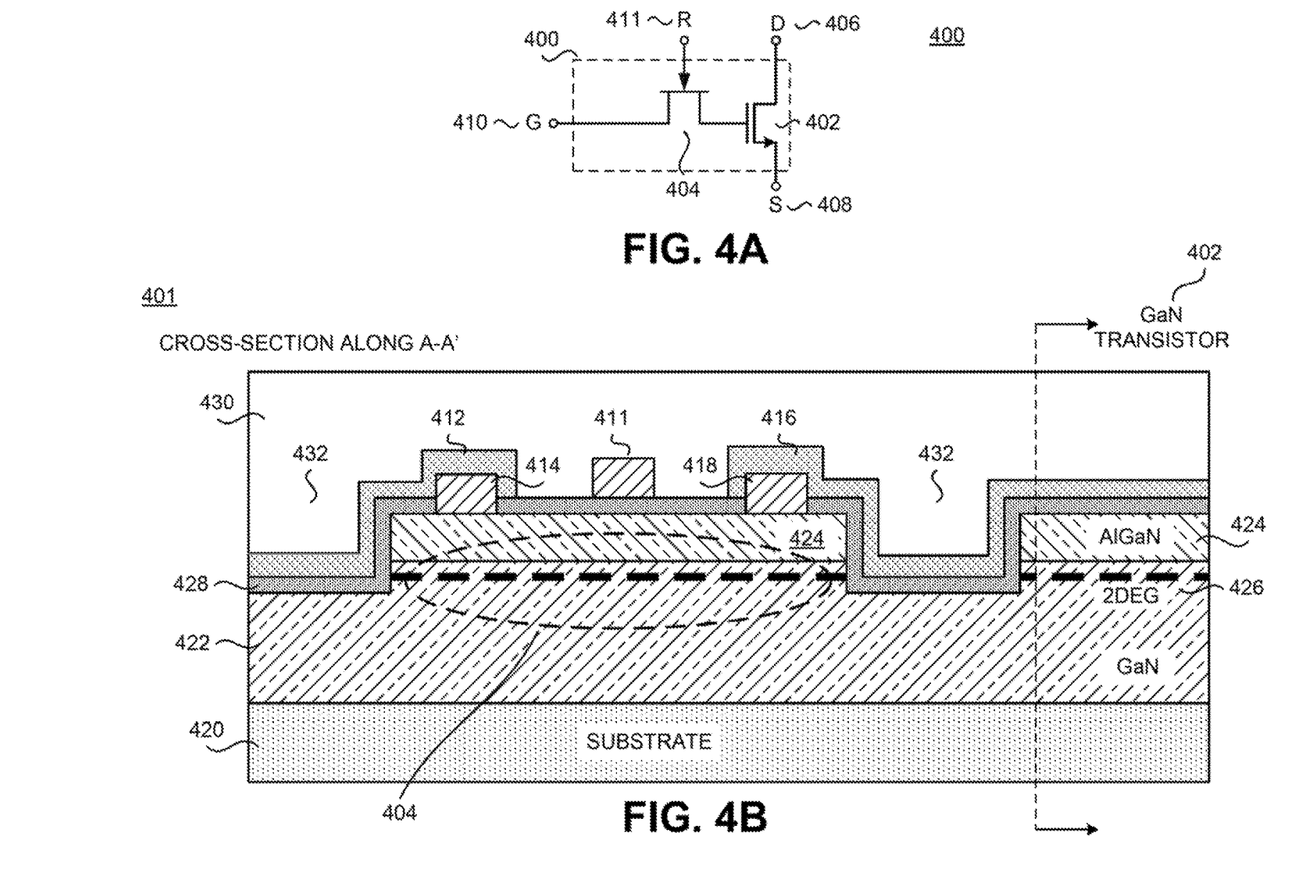
FIG. 4A is another example schematic of a semiconductor device with an integrated resistor.
FIG. 4B is a cross sectional view of the semiconductor device with an integrated resistor of FIG. 4A taken along cut line A-A' of the example layout of FIG. 1B.

FIG. 4A illustrates another example schematic of a semiconductor device 400 with an integrated resistance. For the example shown, the semiconductor device 400 is similar to the semiconductor device 100 shown in FIG. 1A, however, semiconductor device 400 may utilize a transistor to have a variable integrated gate resistance. As shown, the semiconductor device 400 includes a transistor 492 and the gate resistance 404. However, the gate resistance 404 is exemplified by a transistor (for example, a JFET). The semiconductor device 400 further includes a drain terminal 406, a source terminal 408, and a gate terminal 410. The drain terminal 406 is coupled to the drain of transistor 402 while the source terminal 408 is coupled to the source of transistor 402. The gate terminal 410 is coupled to the gate of the transistor 402 through the gate resistance 404 (i.e. JFET). Or in other words, the gate resistance 404 is coupled between the gate terminal 410 and the gate of transistor 402. In the example shown, the gate of transistor 402 is coupled to the drain of the gate resistance 404 (exemplified as a transistor) and the gate terminal 410 is coupled to the source of the gate resistance 404. The device 400 further includes a resistance terminal 411. The resistor terminal 411 is coupled to the gate of the transistor 404 exemplifying the gate resistance. In response to the signal received at the resistor terminal 411, the value of the gate resistance/transistor 404 may vary. Further, the semiconductor device 400 may have a similar top level view as FIG. 1B with the addition of another ohmic contact (representing the resistor terminal 411) between ohmic contacts 118 and 112 along the first direction and substantially spans the second direction.

FIG. 4B illustrates a cross sectional view of a semiconductor device 400 with an integrated gate resistor 404 taken along cut line A-A' as shown in FIG. 1B with an additional ohmic contact 411. It is appreciated that similarly named and numbered elements couple and function as described above. Further, the cross section of device 400 is illustrated with voids 432 that laterally separate the active area of gate resistor 404 from the active area of GaN transistor 402. It is appreciated that instead of voids 432, ion implantation regions (as shown in FIG. 3A) may be used to isolate gate resistor 404 from GaN transistor 402.

Semiconductor device 400 shown in FIG. 4B shares many similarities with device 200 shown in FIG. 2A, however, device 400 further includes additional metal contact 411, which is an isolated contact. In the example shown, metal contact 411 (representative of a resistor control terminal) is deposited on gate dielectric layer 428 above gate resistor 404. Metal contact 411 is laterally disposed between ohmic contact 414 (electrically connected to gate bus 412) and ohmic contact 418 (electrically connected to the array of the gates 416). A composite passivation layer 430 is disposed above gate bus 412, array of gates 416, and metal contact 411. Note that composite passivation layer 430 fills voids 432.

Practitioners in the art will understand that, as configured, the resistance of gate resistor 404 may vary under control of a voltage applied to a metal contact 411. That is, metal contact 411 acts as a gate in a field-effect transistor configuration, the gate controlling the electric charge in the electrical charge layer 426 that flows as a current laterally between ohmic contacts 414 and 416 to. The electric charge flow, and hence the current, may be controlled by a voltage applied from an external circuit to metal contact 411. As such, the signal received at metal contact 411 may control the amount of charge flowing in the electrical charge layer 404 and, as such, vary the resistance of gate resistor 404.

Figure 5:
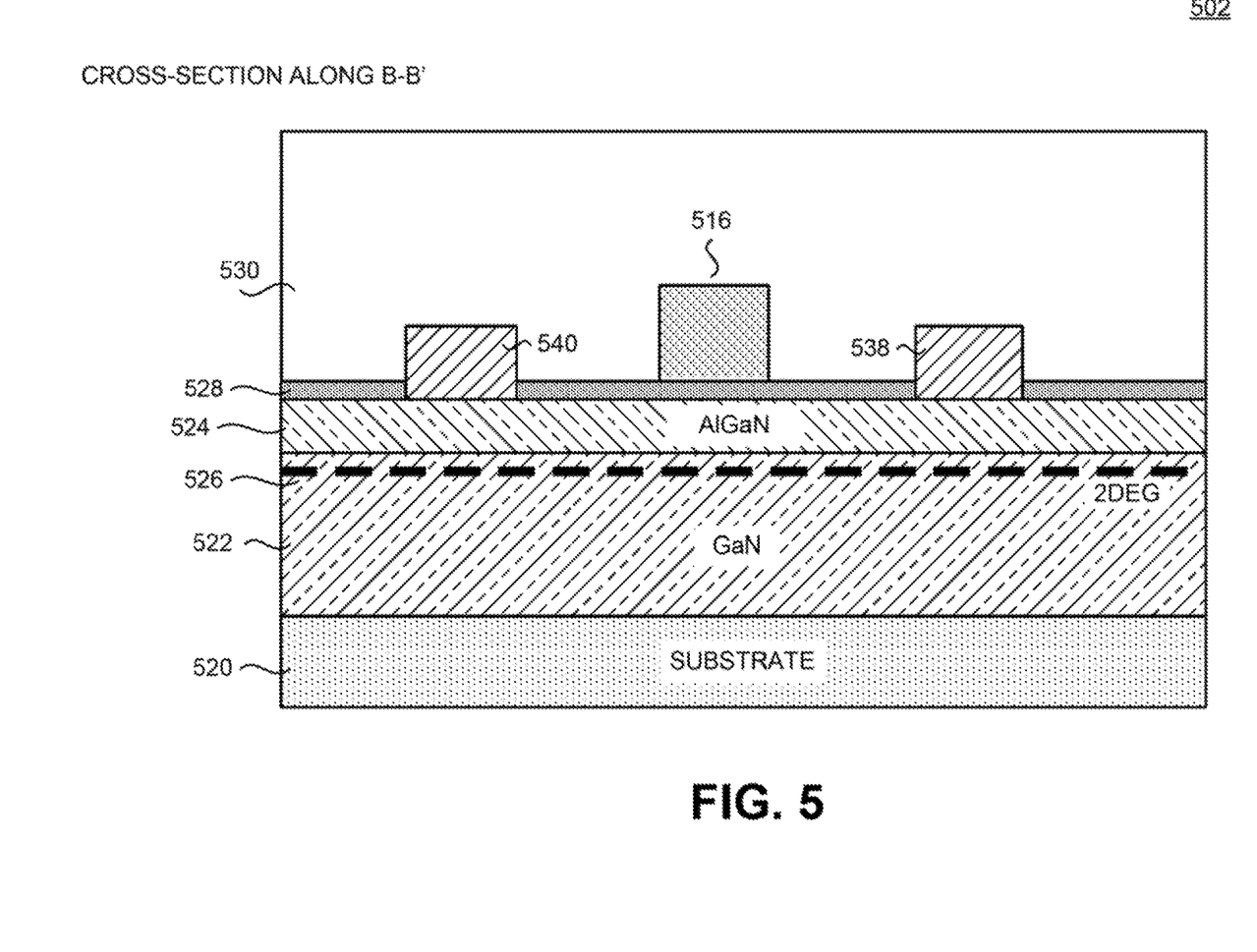
FIG. 5 is a cross sectional view of the semiconductor device with an integrated resistor of FIG. 4A taken along cut line B-B' of the example layout of FIG. 1B.

FIG. 5 is a cross sectional view of a semiconductor device 500 with an integrated resistor, the view taken along cut line B-B' of the example layout of FIG. 1B. In particular, FIG. 5 illustrates the cross section of one of the transistors which comprise power transistor 102 of FIG. 1A. Cut line B-B' is taken substantially along the second lateral direction of semiconductor device 500. It is appreciated that FIG. 5 shares similar features as shown in FIGS. 2A, 3A, and 4B. In addition, similarly named and numbered elements couple and function as described above.

As shown in FIG. 5, substrate 520 is disposed at the bottom of the semiconductor device 500. Substrate 500 may be comprise sapphire ($Al_2O_3$), silicon (Si), gallium nitride (GaN), gallium arsenide (GaAs), silicon carbide (SiC), or other substrate material. First active layer 522 is disposed above substrate 520 and may comprise of GaN, indium nitride (InN), aluminum nitride (AlN), aluminum gallium nitride (AlGaN), indium gallium nitride (InGaN), or aluminum indium gallium nitride (AlInGaN). In other examples, first active layer 522 may comprise different semiconductor materials containing nitride compounds or other Group III-IV elements. In one example, first active layer 522 may be in a range of 1-10 microns thick. In another example, first active layer may be in a range of 2-6 microns thick. To avoid possible problems with lattice mismatch and/or differences in thermal coefficients of expansion, one or more additional layers may be disposed between substrate 520 and first active layer 522. For example, an optional thin nucleation layer may be formed between substrate 520 and first active layer 522.

Second active layer 524 is disposed above first active layer 522 and may comprise AlGaN, aluminum indium nitride (AlInN), indium arsenide (InAs), aluminum arsenide (AlAs), indium gallium arsenide (InGaAs), aluminum gallium arsenide (AlGaAs), or indium aluminum gallium arsenide (InAlGaAs). In other example, second active layer 524 may comprise different Group III-IV nitride or arsenide semiconductor materials. In one example, second active layer 524 may be in a range of 10-40 nanometers (nm) thick. For an example AlGaN second active layer 524, second active layer 524 may be 15-30% aluminum to gallium nitride. Further, the material of second active layer 524 may be a non-stoichiometric compound. In such materials, the ratios of the elements are not easily represented by ordinary whole numbers. For example, second active layer 524 may be a non-stoichiometric compound of a Group III-IV nitride semiconductor material such as $Al_xGa_{1-x}N$, where $0<X<1$.

Further shown in FIG. 5 is electrical charge layer 526 formed between first active layer 522 and second active layer 524 due to the bandgap difference between the two layers, spontaneous and/or piezoelectric polarization discontinuity, or intentional doping of the first active layer 522 and/or the second active layer 524. Electrical charge layer 526 defines a lateral conductive channel which is also called a two-dimensional electron gas (2DEG) layer because electrons, trapped in a quantum well that results from the bandgap difference between first active layer 522 and second active layer 524 are free to move in two lateral dimensions but are tightly confined in the third (vertical) dimension.

Ohmic contacts 540 & 538 are shown disposed on second active layer 524. In one embodiment, ohmic contacts 540 & 528 are the source contact and the drain contact, respectively, of transistor 102 of FIG. 1A. Further shown in FIG. 5 is gate dielectric layer 528 disposed on top of second active layer 524. Gate dielectric layer 528 may include various materials suitable for forming a gate insulator such as aluminum oxide ($Al_2O_3$), zirconium dioxide ($ZrO_2$), aluminum nitride (AlN), hafnium oxide ($HfO_2$), silicon dioxide ($SiO_2$), silicon nitride (SiN, $Si_3N_4$), aluminum silicon nitride (AlSiN), carbon nitride (CN), boron nitride (BN) or other suitable gate dielectric materials. In another example, gate dielectric layer 528 may be a nitride-based material which may conserve the atomic arrangement with second active layer 524. Although FIG. 5 illustrates a single gate dielectric layer, it should be appreciated that multiple gate dielectric layers may also be utilized.

In FIG. 5, gate contact 516 is shown disposed on gate dielectric layer 528, which in one example is an isolated contact. In the example shown, gate contact 516 functions as a gate terminal of transistor 102 of FIG. 1A. The gate contact 516 is one of the finger members of the gate array. Composite passivation layer 530 is disposed above, and covering, each of contacts 516, 538, 540 and gate dielectric layer 528. In one example, composite passivation layer 530 may include multiple dielectric layers, a passivation layer, field plate material, and metal layers which make up semiconductor device 500. Example of such layers include the gate, source and drain field plates for contacts 516, 540, and 538 or additional passivation layers. Some of these layers may be used for electric field distribution.

In operation, semiconductor device 500 is configured as a transistor, with electric charge in the electrical charge layer 526 flowing as a current laterally between ohmic contacts 540 and 538. This current may also flow in an externally coupled circuit. The electric charge flow, and hence the current, may be controlled by a voltage applied from the external circuit to gate contact 516.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention. These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

We claim:

1. A heterostructure semiconductor device comprising:
    a first active layer;
    a second active layer disposed on the first active layer, an electrical charge layer being disposed between the first and second active layers;
    a power transistor having a first active area which includes a first portion of the first active layer and a first portion of the second active layer, in operation, a current flowing through a first portion of the electrical charge layer;
    a gate array that laterally extends over the first active area of the power transistor, the gate array functioning as a gate of the power transistor;
    a gate resistor having a second active area which includes a second portion of the first active layer, a second portion of the second active layer, and a second portion of the electrical charge layer, the second active area being electrically isolated from the first active area;
    first and second contacts respectively disposed at first and second lateral ends of the gate resistor, the first and second contacts being electrically connected to the second portion of the second active layer, the second contact also being electrically connected to the gate array; and
    a gate bus electrically connected to the first contact.

2. The heterostructure semiconductor device of claim 1 wherein the gate resistor has a resistance value defined by a length and a width of the second active area, the length extending in a first lateral direction and the width extending in a second lateral direction substantially perpendicular to the first lateral direction.

3. The heterostructure semiconductor device of claim 2 wherein the length of the second active area substantially comprises a distance in the first lateral direction between the first and second contacts.

4. The heterostructure semiconductor device of claim 1 wherein the gate array is insulated from the first portion of the second active layer by a gate dielectric layer.

5. The heterostructure semiconductor device of claim 1 wherein the gate array comprises a plurality of fingers, each of which extends in the first lateral direction over the first active area.

6. The heterostructure semiconductor device of claim 5 wherein the gate array includes a connecting portion that extends in the second lateral direction, the plurality of fingers being connected to each other via the connecting portion.

7. The heterostructure semiconductor device of claim 6 wherein the connecting portion has a width in the second lateral direction that is substantially equal to the width of the gate resistor.

8. The heterostructure semiconductor device of claim 2 wherein the resistance value is determined to substantially dampen oscillations of the current flowing in the power transistor.

9. The heterostructure semiconductor device of claim 1 wherein the first active layer comprises a nitride-based semiconductor material.

10. The heterostructure semiconductor device of claim 1 wherein the first active layer is selected from the group consisting of gallium nitride (GaN), indium nitride (InN), aluminum nitride (AlN), aluminum gallium nitride (AlGaN), indium gallium nitride (InGaN), or aluminum indium gallium nitride (AlInGaN).

11. The heterostructure semiconductor device of claim 1 wherein the first active layer has a thickness in a vertical direction in a range of 1-10 microns thick.

12. The heterostructure semiconductor device of claim 1 wherein the second active layer has a thickness in a vertical direction in a range of 10-40 nanometers (nm) thick.

13. The heterostructure semiconductor device of claim 1, wherein the first and second active layer define a void that electrically isolates the second active area from the first active area.

14. The heterostructure semiconductor device of claim 1 further comprising an implantation region that electrically isolates the second active area from the first active area.

15. The heterostructure semiconductor device of claim 1 further comprising a resistor control terminal disposed above the second active area, a signal applied to the resistor control terminal controlling a resistance value of the gate resistor.

16. The heterostructure semiconductor device of claim 1 wherein the resistor control terminal comprises an additional metal contact disposed on a gate dielectric layer.

17. A method of fabricating a heterostructure semiconductor device comprising:
    forming a first active layer on a substrate;
    forming a second active layer on the first active layer, the first active layer and the second active layer having different bandgaps such that an electrical charge layer is formed therebetween;
    defining a first active area and a second active area, the first active area including a first portion of the first active layer, a first portion of the second active layer, and a first portion of the electrical charge layer, the second active area including a second portion of the first active layer, a second portion of the second active layer, and a second portion of the electrical charge layer, the second active area being electrically isolated from the first active area, wherein a power transistor of the heterostructure semiconductor comprises the first active area, and an integrated gate resistor of the heterostructure semiconductor device comprises the second active area;
    forming first and second contacts directly on the second portion of the second active layer, the first and second contacts being laterally separated by a distance, the first and second contacts comprising first and second terminals of the integrated gate resistor, respectively; and
    forming an array of gates that laterally extends over the first active area of the power transistor, the array of gates being electrically connected to the second contact and functioning as a gate of the power transistor.

18. The method of claim 17 wherein the forming of the array of gates comprises:
    forming a gate dielectric layer that extends over the first and second portions of the second active layer;

forming a metal layer over the gate dielectric layer;
patterning the metal layer to define the array of gates.

19. The method of claim 18 wherein the patterning the metal layer also defines a gate bus that is electrically connected to the first ohmic contact.

20. The method of claim 17 wherein the defining of the first and second active areas comprises etching a void in the first and second active layers between the first and second active areas.

21. The method of claim 17 wherein the defining of the first and second active areas comprises implanting ions in a region of semiconductor material between the first and second active areas.

* * * * *